United States Patent [19]

Kokubo et al.

[11] Patent Number: 5,378,936
[45] Date of Patent: Jan. 3, 1995

[54] VOLTAGE LEVEL DETECTING CIRCUIT

[75] Inventors: Nobuyuki Kokubo; Kazuya Ikeda, both of Hyogo, Japan

[73] Assignee: Mitsubishi Denki Kabushiki Kaisha, Tokyo, Japan

[21] Appl. No.: 219,865

[22] Filed: Mar. 30, 1994

Related U.S. Application Data

[63] Continuation of Ser. No. 921,652, Jul. 30, 1992, abandoned.

[30] Foreign Application Priority Data

Dec. 19, 1991 [JP] Japan .................................. 3-337149

[51] Int. Cl.⁶ ............................................. H03K 17/22
[52] U.S. Cl. ........................................ 327/77; 327/78; 327/546
[58] Field of Search ................... 307/272.3, 296.4, 350, 307/354, 355, 356, 360, 362, 363

[56] References Cited

U.S. PATENT DOCUMENTS

| | | | |
|---|---|---|---|
| 4,142,118 | 2/1979 | Guritz | 307/296.4 |
| 4,224,539 | 9/1980 | Musa et al. | 307/362 |
| 4,613,770 | 9/1986 | Raab | 307/350 |
| 4,716,372 | 12/1987 | Fauser et al. | 328/146 |
| 5,049,869 | 9/1991 | Harris | 340/815.01 |
| 5,081,708 | 1/1992 | Sacchi et al. | 455/234 |
| 5,214,316 | 5/1993 | Nagai | 307/272.3 |

FOREIGN PATENT DOCUMENTS

| | | | |
|---|---|---|---|
| 0154365 | 12/1979 | Japan | 307/272.3 |
| 0256015 | 10/1988 | Japan | 307/272.3 |
| 3284122 | 12/1991 | Japan | 307/272.3 |
| 1338047 | 9/1987 | U.S.S.R. | 307/272.3 |

OTHER PUBLICATIONS

Blue et al., IBM Tech. Discl. Bultn., "Automatic Restart for Microprocessors", Mar. 1984, pp. 5319–5320.
IBM Tech. Discl. Bultn., "Restart Circuit for Microprocessors", Apr. 1986, pp. 4815–4816.

*Primary Examiner*—Timothy P. Callahan
*Assistant Examiner*—Terry D. Cunningham
*Attorney, Agent, or Firm*—Lowe, Price, LeBlanc & Becker

[57] ABSTRACT

A power supply voltage level detecting circuit includes a reference voltage generating circuit for generating a constant reference voltage independent of a power supply voltage, a to-be-compared voltage generating circuit for generating a voltage to be compared changing dependent upon the power supply voltage, a current mirror type differentially amplifying circuit for amplifying differentially the reference voltage and the voltage to be compared, and a determining circuit for generating a level detecting signal indicating whether or not the power supply voltage has attained a predetermined level in accordance with an output of the differentially amplifying circuit. The to-be-compared voltage generating circuit generates the voltage to be compared by dropping the power supply voltage using the resistance division or the forward voltage drop of diode. Since a signal corresponding to the power supply voltage level is provided from the differentially amplifying circuit, it is possible to detect the power supply voltage level reliably without being affected by variation of an input logic threshold voltage of an inverter circuit due to the manufacturing process.

2 Claims, 5 Drawing Sheets

VOLTAGE LEVEL DETECTING CIRCUIT

This application is a continuation of application Ser. No. 07/921,652 filed Jul. 30, 1992, now abandoned.

BACKGROUND OF THE INVENTION

1. Field of the Invention

The present invention relates to a circuit configuration for detecting a level of a predetermined voltage, in particular, of a power supply voltage in a semiconductor device.

2. Description of the Background Art

Since a semiconductor device has a predetermined rated value of a power supply voltage, it is required that the power supply voltage be within a predetermined range for stable operation. An extremely high operating power supply voltage causes dielectric breakdown and the like of circuit elements, while an extremely low operating power supply voltage does not contribute to desired operating characteristics and stable operation of a circuit, thereby impairing reliability of a semiconductor device.

Therefore, as shown in FIG. 5, a circuit for monitoring the level of the power supply voltage is provided in a semiconductor device.

FIG. 5 is a diagram showing the entire configuration of a general semiconductor device. A semiconductor device 100 includes a power supply voltage level detecting circuit 110 for detecting a level of an externally applied power supply voltage Vcc and a function circuit 120 for operating with power supply voltage Vcc as an operating power supply voltage to implement a desired function.

The power supply voltage level detecting circuit 110 generates an abnormality detecting signal, applies the signal to the function circuit 120 and stops or resets operation of the function circuit 120, when the level of the power supply voltage Vcc attains a predetermined level.

The function circuit 120 may be of any type as far as it is of a type which processes signals digitally. The function circuit 120 may also be a circuit that operates with an internal step-down voltage of a stepped down power supply voltage Vcc as an operating power supply voltage.

FIG. 6 is a diagram showing a specific configuration of the power supply voltage level detecting circuit shown in FIG. 5. Referring to FIG. 6, the power supply voltage level detecting circuit 110 includes a reference voltage generating circuit 4 for generating a reference voltage of a constant voltage level independent of the voltage level of the power supply voltage Vcc, an inverter circuit 7a for receiving an output of the reference voltage generating circuit 4, and an inverter circuit 7b for receiving an output of the inverter circuit 7a.

The reference voltage generating circuit 4 includes a p channel MOS (insulated gate type field effect) transistor 2 connected between a node (a power supply line 30) receiving the power supply voltage Vcc and a reference voltage output node 8, an n channel MOS transistor 1a provided between the reference voltage output node 8 and a node 31, and n channel MOS transistors 1b, 1c and 1d connected in series between node 31 and the other power supply potential (which is usually a ground potential and hereinafter simply referred to as a ground potential) Vss and each serving as a diode. The transistor 2, having its gate connected to the ground potential Vss, serves as a resistance. The transistor 1a receives a reset signal φR at its gate, is rendered conductive only when the reset signal φR is at a high level, and connects the node 31 to the reference voltage output node 8 electrically.

Transistors 1b to 1d have respective gates connected to respective drains, and each serves as a diode which decreases the voltage by its threshold voltage Vthn. The on-resistance of the transistor 2 is rendered relatively large. The on-resistance of the transistor 1a is rendered sufficiently small. Therefore, a reference voltage independent of the power supply voltage Vcc of voltage level Vss+3·Vthn is generated from the reference voltage output node 8. The reset signal φR is at a high level in normal operation, and the transistor 1a is provided to reduce power consumption by rendering a current flow path in the reference voltage generating circuit 4 nonconductive/conductive.

The inverter circuit 7a includes complementarily connected p channel MOS transistor 22a and n channel MOS transistor 21a between the power supply line 30 and the ground potential Vss. The inverter circuit 7b includes complementarily connected p channel MOS transistor 22b and n channel MOS transistor 21b between the power supply line 30 and the ground potential Vss. Transistors 22a and 21a receive at their gates a reference voltage which appears at the output node 8 of the reference voltage generating circuit 4. Transistors 22b and 21b receive at their gates a voltage which appears at the output node 10 of the inverter circuit 7a. A voltage level detecting signal indicating whether or not the power supply voltage Vcc has attained a predetermined level is generated from the output node 11 of the inverter circuit 7b. Operation will now be described.

FIG. 7 is a graph showing dependency on the power supply voltage of input/output characteristics of an inverter circuit. Referring to FIG. 7, the ordinate shows an input voltage of the inverter circuit, and the abscissa shows an output voltage of the same. As shown in FIG. 7, the inverter circuit has its input logic threshold voltage (the level identifying high and low levels of an input signal) increased in accordance with the power supply voltage Vcc. Referring to FIG. 7, the input logic threshold voltage (hereinafter simply referred to as a threshold voltage) is VT1 when the power supply voltage Vcc is 5 V, the threshold voltage is VT2 when the power supply voltage Vcc is 6 V, and the threshold voltage is VT3 when the power supply voltage Vcc is 7 V. In general, in a CMOS inverter circuit of a p channel MOS transistor and an n channel MOS transistor, the relation between the threshold voltage VT and the power supply voltage Vcc is given by the following formula (1).

$$VT = \frac{Vcc + Vthp + Vthn + \sqrt{\frac{\beta n}{\beta p}}}{1 + \sqrt{\frac{\beta n}{\beta p}}} \quad (1)$$

$$\beta n = \beta on \cdot \frac{Wn}{Ln}$$

$$\beta p = \beta op \cdot \frac{Wp}{Lp}$$

In the above formula (1), Vthp and Vthn indicate threshold voltages of a p channel MOS transistor and an n channel MOS transistor, respectively. Wn and Ln indicate gate width and gate length of an n channel MOS transistor, respectively. Gate length indicates the length of the gate along the channel direction between the source and drain of an MOS transistor, and gate width indicates the width of the source and drain impurity regions in the direction orthogonal to the gate length.

Wp and Lp indicate gate width and gate length, respectively, of a p channel MOS transistor. $\beta$on and $\beta$op are constants proportional to capacitance of a gate insulating film per unit area, which are usually on the order of:

$$\beta on:\beta op=2:1$$

As apparent from the formula (1), the threshold voltage VT of an inverter circuit increases in accordance with the power supply voltage Vcc.

FIG. 8 shows dependency on a power supply voltage of an output of each circuit shown in FIG. 6. Referring to FIG. 8, the ordinate shows power supply voltage Vcc, and the abscissa shows voltage.

A voltage given by the sum of a forward drop voltage across transistors 1b to 1d and the ground potential Vss is applied to the reference voltage output node 8 of the reference voltage generating circuit 4. In other words, a voltage of 3·Vthn is supplied as an output from the reference voltage output node 8, where Vss is 0 V. The threshold voltage Vthn of MOS transistors 1b to 1d is considered to be almost constant independent of the operating power supply voltage Vcc (strictly speaking, the threshold voltage subtly varies in response to variation of operating power supply voltage Vcc due to the influence of back gate bias and the like, but this variation of the threshold voltage is considered to be negligible).

Therefore, as shown by curve I in FIG. 8, a constant voltage of approximately 4 V is supplied as an output from the reference voltage output node 8.

The inverter circuit 7a receives a reference voltage which appears at the reference voltage output node 8. The determination by inverter circuit 7a between high and low levels of the reference voltage which is supplied as an output from the reference voltage output node 8 is made in accordance with the level of the power supply voltage Vcc. The level of the reference voltage (4 V) supplied as an output from the reference voltage output node 8 is now assumed to be larger than threshold voltages VT1 and VT2 of the inverter circuit shown in FIG. 7 and smaller than threshold voltage VT3 of the same.

Referring now to FIG. 8, curve I shows voltage which appears at the reference voltage output node 8 of the reference voltage generating circuit 4. Curve II shows voltage change which appears at the output node 10 of the inverter circuit 7a. Curve III shows voltage change which appears at the output node 11 of the inverter circuit 7b.

The reference voltage which appears at the output node 8 of the reference voltage generating circuit 4 is constant, approximately 4 V, as shown by curve I. In a state where the power supply voltage Vcc is low, i.e., 5 V or 6 V, the reference voltage which appears at the reference voltage output node 8 of the reference voltage generating circuit 4 is higher than the threshold voltage (indicated by curve VT in FIG. 8) of the inverter circuit 7a. Therefore, the inverter circuit 7a determines the reference voltage from the reference voltage output node 8 to be at a high level to supply the output node 10 with a low-level signal as an output. The inverter circuit 7b supplies the output node 11 with a high-level signal as an output in accordance with the low-level signal from the inverter circuit 7a. Since the high-level signal output from the inverter circuit 7b is applied through the p channel MOS transistor 22b, the voltage level is the level of the power supply voltage Vcc.

As the power supply voltage Vcc increases, the threshold voltage VT of the inverter circuit 7a increases as shown by curve VT in FIG. 8. When the power supply voltage Vcc exceeds a certain voltage level (for example, 7 V), the reference voltage from the output node 8 of the reference voltage generating circuit 4 becomes lower than the threshold voltage VT of the inverter circuit 7a. In this case, the inverter circuit 7a determines the reference voltage of the output node 8 to be at a low level to supply the output node 10 with a high-level signal as an output. The inverter circuit 7b supplies a low-level signal as an output in response to the high-level signal provided from the inverter circuit 7a. The voltage level of the high-level output signal of the inverter circuit 7a increases as the level of the power supply voltage Vcc increases.

Since the inverter circuit 7b receives an output signal of the inverter circuit 7a to further amplify the signal amplified at the inverter circuit 7a, the output response characteristic thereof becomes faster than that of the inverter circuit 7a.

As a result, since a level detecting signal which appears at the output node 11 of the inverter circuit 7a falls from a high level to a low level when the power supply voltage Vcc attains, for example, the level of 7 V, it is possible to detect that the power supply voltage Vcc has attained a predetermined voltage level by observing this change.

A conventional power supply voltage level detecting circuit utilizes change of the threshold voltage of an inverter circuit depending on the power supply voltage. When power supply voltage dependency characteristics of the threshold voltage of the inverter circuit change significantly, since the detected level of power supply voltage changes considerably, it becomes impossible to detect a desired level of power supply voltage. This is why it is necessary to precisely control the threshold voltage of an inverter circuit.

The threshold voltage of an inverter circuit, as shown in the formula (1), depends on various parameters such as threshold voltage, gate width, gate length, size and the like of a transistor, which are components of the formula (1). These parameters are subjected to variation during the manufacturing processes. Therefore, there arises a problem that it is difficult to give precisely desired power supply voltage dependency characteristics to the threshold voltage of an inverter circuit.

SUMMARY OF THE INVENTION

An object of the present invention is to provide a power supply voltage level detecting circuit which can detect a precisely desired power supply voltage level.

Another object of the present invention is to provide a voltage level detecting circuit which can detect a desired voltage level accurately without being influenced by variation of various kinds of parameters of the manufacturing process.

According to the present invention, a voltage level detecting circuit includes reference voltage generating circuitry for generating a reference voltage independent of a first voltage, voltage generating circuitry for generating a voltage to be compared dependent on the first voltage, differentially amplifying circuitry for amplifying differentially the reference voltage and the voltage to be compared, and determining circuitry for determining whether or not the first voltage has attained a predetermined level in response to an output of the differentially amplifying circuitry.

The differentially amplifying circuitry preferably includes a current mirror type circuit as current supplying circuitry. The determining circuitry preferably includes an inverter circuit configured of field effect transistors.

The reference voltage generating circuitry preferably includes a resistance circuit provided between a first voltage supply and a reference voltage output node, and a field effect transistor diode-connected between the reference voltage output node and a second voltage supply. The to-be-compared voltage generating circuitry preferably includes a field effect transistor diode-connected between the first voltage supply and a comparison voltage output node, and a resistance circuit connected between the comparison voltage output node and the second voltage supply.

In the present invention, since the reference voltage and the voltage to be compared are differentially amplified, it is possible to detect the level of the first voltage without depending on the threshold voltage of the inverter circuit, and to eliminate the dependency on the threshold voltage of the inverter circuit of the detected voltage level.

In the aforementioned preferred aspect of the present invention, since a differentially amplifying circuit of a current mirror type is used, it is possible to compare the reference voltage with the voltage to be compared and to produce a signal based on the comparison result. In addition, since an MOS type inverter circuit composed of field effect transistors is used as determining circuitry, it is possible to amplify an output of differentially amplifying circuitry with low current consumption, thereby producing a reliable voltage level detecting signal.

In the aforementioned another preferred aspect of the present invention, since the first voltage is stepped down to produce the voltage to be compared by a diode-connected field effect transistor, it is possible to produce a voltage to be compared which reflects change of the first voltage accurately.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
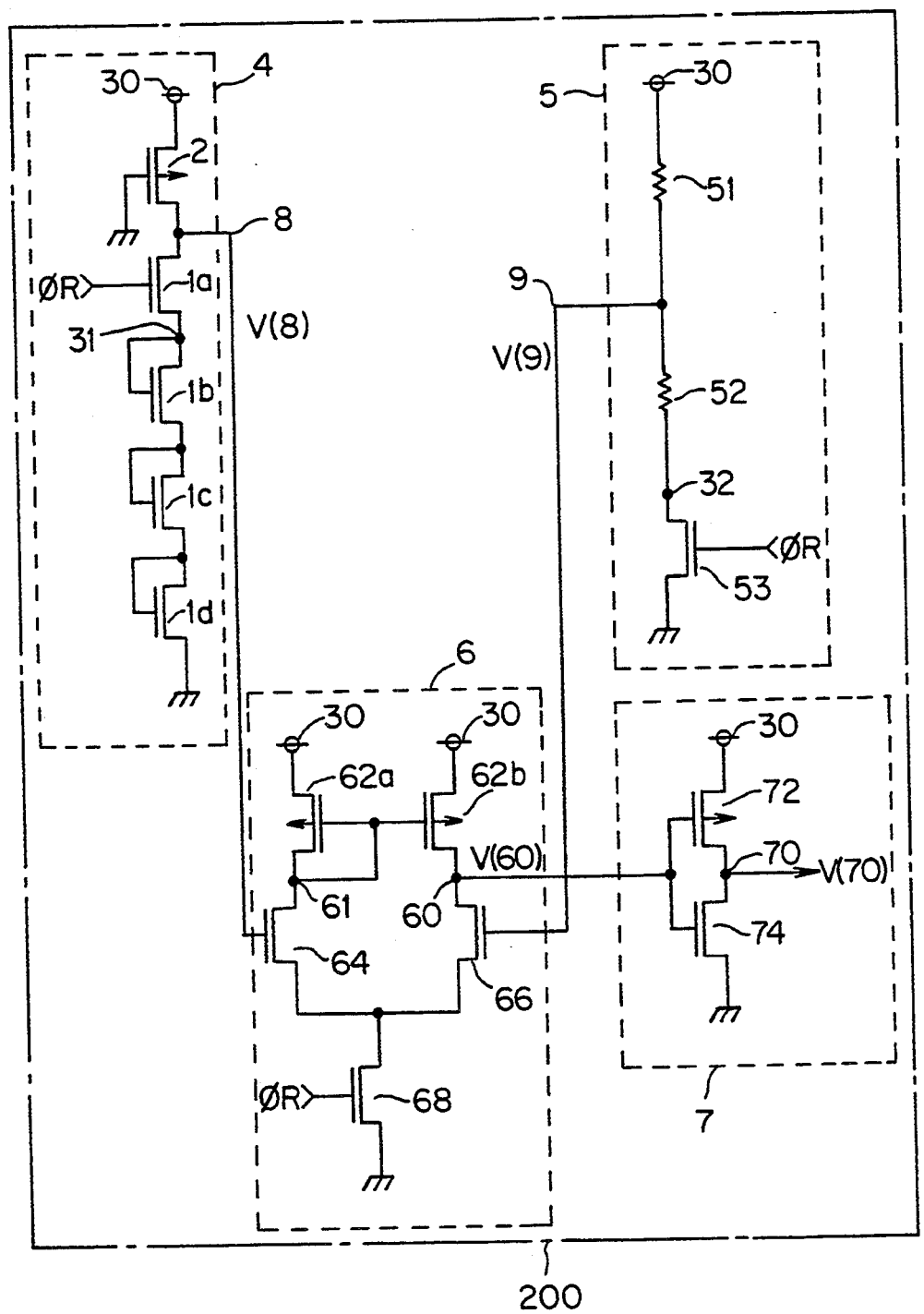
FIG. 1 is a diagram showing a configuration of a power supply voltage level detecting circuit according to one embodiment of the present invention.

FIG. 1 shows a configuration of a power source voltage level detecting circuit according to one embodiment of the present invention. Referring to FIG. 1, a power source voltage level detecting circuit 200 includes a reference voltage generating circuit 4 for generating a stable constant voltage V(8) independent of power supply voltage Vcc as a first voltage, a to-be-compared voltage generating circuit 5 for generating voltage to be compared V(9) changing dependent upon power supply voltage Vcc, a differentially amplifying circuit 6 for amplifying differentially the reference voltage V(8) and the voltage to be compared V(9), and a determining circuit 7 for determining whether or not the power supply voltage has attained a predetermined level in response to an output of a differentially amplifying circuit 6.

Figure 5:
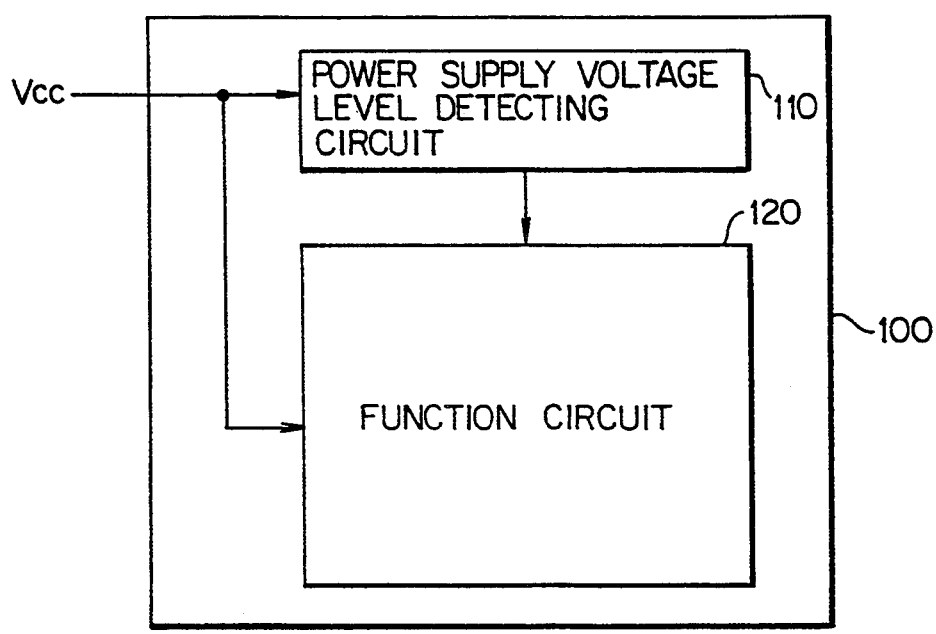
FIG. 5 is a diagram showing a configuration of a general semiconductor device.
Figure 6:
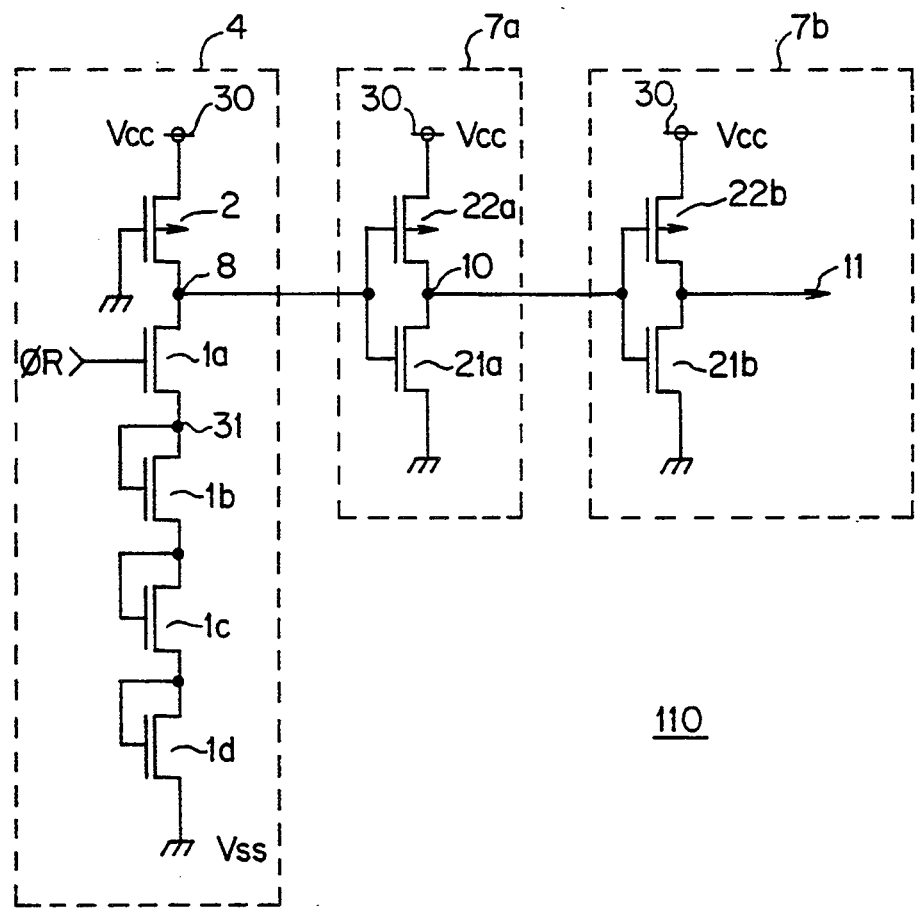
FIG. 6 is a diagram showing a configuration of a conventional power supply voltage level detecting circuit.
Figure 7:
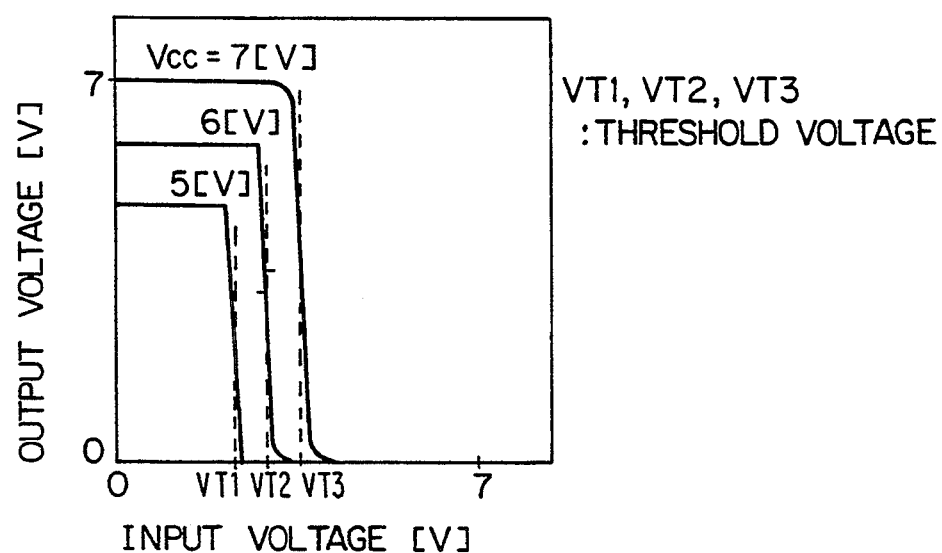
FIG. 7 is a graph showing an input logic threshold of an inverter circuit and the power supply voltage dependency.

The power supply voltage level detecting circuit 200, corresponding to the power supply voltage level detecting circuit 110 shown in FIG. 5, is formed on the same semiconductor chip as a semiconductor device (a function circuit). The power supply voltage level detecting circuit is preferably intended to be applied to a digital semiconductor device, and includes an MOS transistor as its component.

The reference voltage generating circuit 4 includes a p channel MOS transistor 2 provided between a power supply line 30 for transmitting the power supply voltage Vcc and an output node 8, an n channel MOS transistor 1a provided between the output node 8 and a node 31, and n channel MOS transistors 1b, 1c and 1d each diode-connected between the node 31 and a ground potential which is the other power supply voltage as a second voltage. The transistor 2 has its gate connected to the ground potential, is normally conductive, and serves as a load resistance. The transistor 1a has its on-resistance made small, is rendered conductive in response to a reset signal $\phi R$, and activates the reference voltage generating circuit 4. Each of transistors 1b to 1d serves as a diode and acts as a voltage dropping means. The reference voltage V(8) supplied as an output from the reference voltage output node 8 provides 3·Vthn. Vthn is a threshold voltage of transistors 1b, 1c and 1d. Therefore, the reference voltage V(8) is a stable constant voltage independent of the power supply voltage Vcc.

The to-be-compared voltage generating circuit 5 includes a resistance 51 connected between the power supply line 30 and an output node 9, a resistance 52 provided between the output node 9 and a node 32, and an n channel MOS transistor 53 connected between the node 32 and a ground potential. The transistor 53 receives the reset signal $\phi R$ at its gate, and activates the to-be-compared voltage generating circuit 5 in response to the reset signal φR. The on-resistance of the transistor 53 is a negligible value compared with the resistance values of resistances 51 and 52. Therefore, the voltage to be compared V(9) supplied as an output from the output node 9 is expressed by:

$$V(9) = Vcc \cdot R52/(R51 + R52)$$

The voltage to be compared V(9) changes dependent upon the power supply voltage Vcc since resistance values R51 and R52 can be considered to be substantially constant.

The differentially amplifying circuit 6 includes a current mirror type circuit as a current supply. The current mirror circuit includes p channel MOS transistors 62a and 62b. The transistor 62a has its one conduction terminal connected to the power supply line 30, and its gate connected to the other conduction terminal. The transistor 62b has its one conduction terminal connected to the power supply line 30, its gate connected to the gate of the transistor 62a, and its other conduction terminal connected to the output node 60. The amount of current flow supplied by transistors 62a and 62b is determined by the voltage level of the node 61.

The differentially amplifying circuit 6 further includes an n channel MOS transistor 64 receiving the reference voltage V(8) at its gate and having one conduction terminal thereof connected to the node 61, and an n channel MOS transistor 66 receiving the voltage to be compared V(9) at its gate and having the other conduction terminal thereof connected to the output node 60. The other conduction terminals of transistors 64 and 66 are commonly connected. The differentially amplifying circuit 6 further includes an n channel MOS transistor 68 receiving the reset signal φR at its gate, having one conduction terminal thereof connected to the other conduction terminals of transistors 64 and 66, and having the other conduction terminal thereof connected to the ground potential. The transistor 68 is rendered conductive in response to the reset signal φR, and activates the differentially amplifying circuit 6.

A determining circuit 7 includes a p channel MOS transistor 72 and an n channel MOS transistor 74 complementarily connected between the power supply line 30 and the ground potential. In other words, the determining circuit 7 is configured of a CMOS inverter circuit. A level detecting signal V(70) indicating whether or not the power supply voltage has attained a predetermined level is provided from the output node 70.

Figure 2:
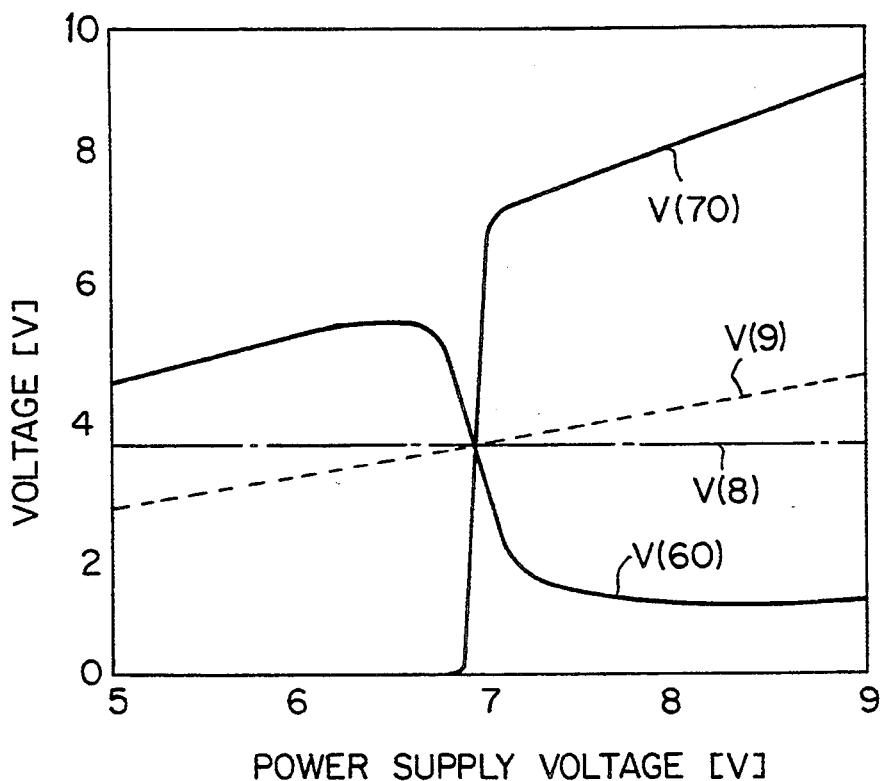
FIG. 2 is a graph showing the power supply voltage dependency of output voltage of each circuit in the power supply voltage level detecting circuit shown in FIG. 1.
Figure 8:
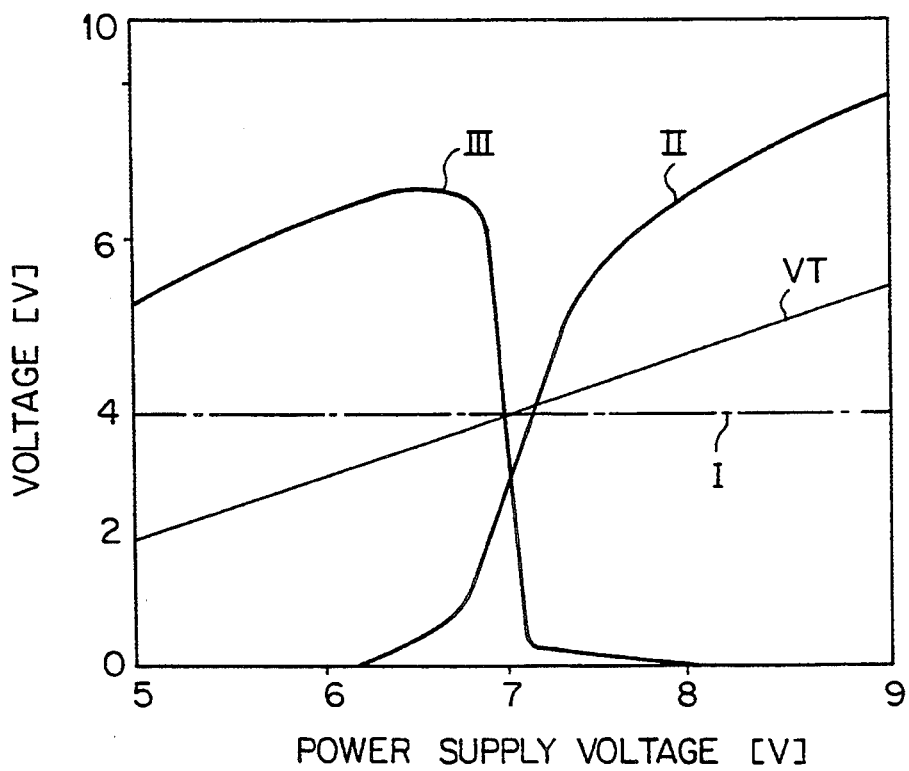
FIG. 8 is a graph showing the power supply voltage dependency of output voltage of each circuit in the power supply voltage level detecting circuit shown in FIG. 6.

FIG. 2 shows the power supply voltage dependency of the output of each circuit of the power supply voltage level detecting circuit shown in FIG. 1. Referring to FIG. 2, the ordinate shows power supply voltage Vcc, and the abscissa shows the level of output voltage of each circuit. Output voltages indicated by respective curves are identified by giving to respective curves the same characters as those of voltages shown in FIG. 1. Description will now be made on operation of the power supply voltage level detecting circuit according to one embodiment of the present invention with reference to FIGS. 1 and 2.

The voltage to be compared V(9) increases in a roughly linear way in accordance with the power supply voltage Vcc, as shown in FIG. 2. The reference voltage V(8) is substantially constant regardless of the power supply voltage Vcc. When the power supply voltage Vcc is a predetermined level (for example, 7 V) or less, the relation between V(8) and V(9) is expressed by V(8) > V(9). In a differential amplifier circuit under the above-described condition, the-on-resistance of the transistor 64 becomes smaller than that of the transistor 66 while the amount of current flowing through the transistor 64 becomes larger than that of the transistor 66, thereby rendering the potential of the node 61 to be lower than that of the node 60. Since the potential of node 61 is fed back to the gates of transistors 62a and 62b, the resistances of transistors 62a and 62b become smaller, causing more current to flow therethrough. As a result, the potential difference between the node 60 and the node 61 is further magnified. More specifically, the potential level of the node 61 attains a high level and that of the node 60 attains a low level. The level of an output voltage V(60) of the differentially amplifying circuit 6 is substantially the level of the power supply voltage Vcc.

The output voltage V(60) amplified at high speed is applied to the determining circuit 7. Even if the threshold voltage of a CMOS inverter circuit configuring the determining circuit 7 shows the same power supply voltage dependency characteristics as those of the voltage V(9), the high level of the output voltage V(60) of the differentially amplifying circuit 6 is at a sufficiently higher level than the threshold voltage (an input logic threshold voltage) of the CMOS inverter circuit configuring the determining circuit 7. Therefore, a level detecting signal V(70) from the determining circuit 7 attains a low level, i.e., the level of the ground potential.

When the reference voltage V(8) and the voltage to be compared V(9) become almost equal, the on-resistances of transistors 64 and 66 become almost equal to cause potential levels of the node 61 and the node 60 to start rising and falling, respectively.

When the reference voltage V(8) becomes lower than the voltage to be compared V(9), the on-resistance of the transistor 64 becomes higher than that of the transistor 66 to cause the potential of the node 61 to be higher than that of the node 60. The amount of current flow supplied by transistors 62a and 62b is reduced due to the potential level of the node 61, the potential of the node 60 is discharged through the transistor 66 at high speed, and the voltage level of the output voltage V(60) of the differentially amplifying circuit 60 decreases to the voltage level determined by the ratio of the on-resistance of the transistor 62b to the sum of on-resistances of transistors 66 and 68.

The low-level voltage provided from the differentially amplifying circuit 6 is sufficiently lower than an input logic threshold voltage of a CMOS inverter circuit configuring the determining circuit 7. As a result, a high-level level detecting signal V(70) is provided from the determining circuit 7. It is detected that the power supply voltage Vcc has attained a predetermined level (shown as 7 V in FIG. 2) by the rise from a low level to a high level of the level detecting signal V(70).

It is possible to detect a subtle change at high speed by differentially amplifying the reference voltage V(8) independent of the power supply voltage Vcc and the voltage to be compared V(9) changing dependent upon the power supply voltage Vcc by the differentially amplifying circuit 6. In addition, since the output of the differentially amplifying circuit can provide the output voltage level which is sufficiently remote from the input logic threshold voltage of the inverter circuit configuring a determining circuit, it is possible to detect reliably that the power supply voltage Vcc has attained a predetermined level even with variation of the input logic threshold voltage of the inverter circuit.

In the above configuration, the reset signal φR is applied to drive the power supply voltage level detecting circuit only for a desired period. A power-on detecting signal generated when detecting power-on may be used as the reset signal φR. The power supply voltage Vcc may also be used as the reset signal φR. Provision of no transistors for receiving the reset signal φR does not directly affect the power supply voltage level detecting function.

Resistances 51 and 52 may be formed by using a polysilicon resistance or diffusion resistance. A diffusion resistance here is a resistance utilizing an impurity region having concentration of impurities adjusted as a resistance.

A resistance-connected MOS transistor may also be used as resistances 51 and 52. Both resistance-connection and diode-connection are the connection structure for connecting the gate and drain of an MOS transistor. Whether the MOS transistor serves as a diode or a resistance is determined by the magnitude of the resistance value of other resistance elements provided in the circuit. When the other resistance elements have the on-resistance of almost the same order value, the MOS transistor serves as a resistance, while it serves as a diode when the resistance value of the other resistance elements is sufficiently large. When resistance-connected MOS transistors are used, the voltage to be compared determined by the ratio of the on-resistances of the MOS transistors used is supplied as an output.

Figure 3:
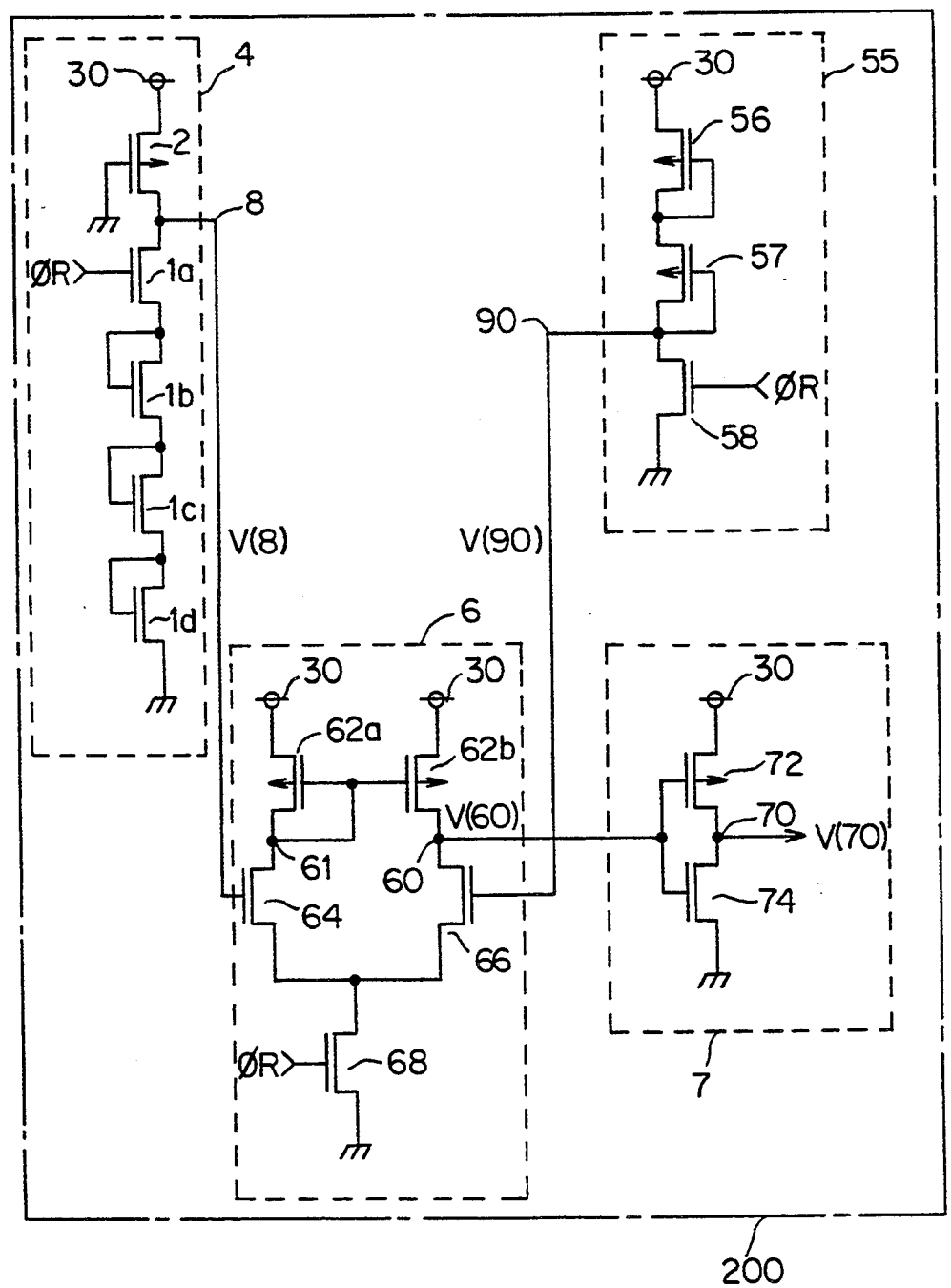
FIG. 3 is a diagram showing a configuration of a power supply voltage level detecting circuit according to another embodiment of the present invention.

FIG. 3 shows a configuration of a power supply voltage level detecting circuit according to another embodiment of the present invention. Referring to FIG. 3, the same reference numerals are given to the portions corresponding to components of the power supply voltage level detecting circuit shown in FIG. 1. The power supply voltage level detecting circuit shown in FIG. 3 has a different configuration from that of FIG. 1 in that the to-be-compared voltage generating circuit for generating the voltage to be compared includes an MOS type transistor.

A to-be-compared voltage generating circuit 55 includes diode-connected p channel MOS transistors 56 and 57 provided between the power supply line 30 and an output node 90, and an n channel MOS transistor 58 provided between the output node 90 and the ground potential and receiving the reset signal φR at its gate. Since the on-resistances of transistors 56 and 57 are sufficiently smaller than that of the transistor 58, transistors 56 and 57 serve as diodes to generate a voltage of Vcc-2·Vthp to the output node 90. Vthp here is a threshold voltage of transistors 56 and 57, which is assumed to be a positive threshold voltage.

Figure 4:
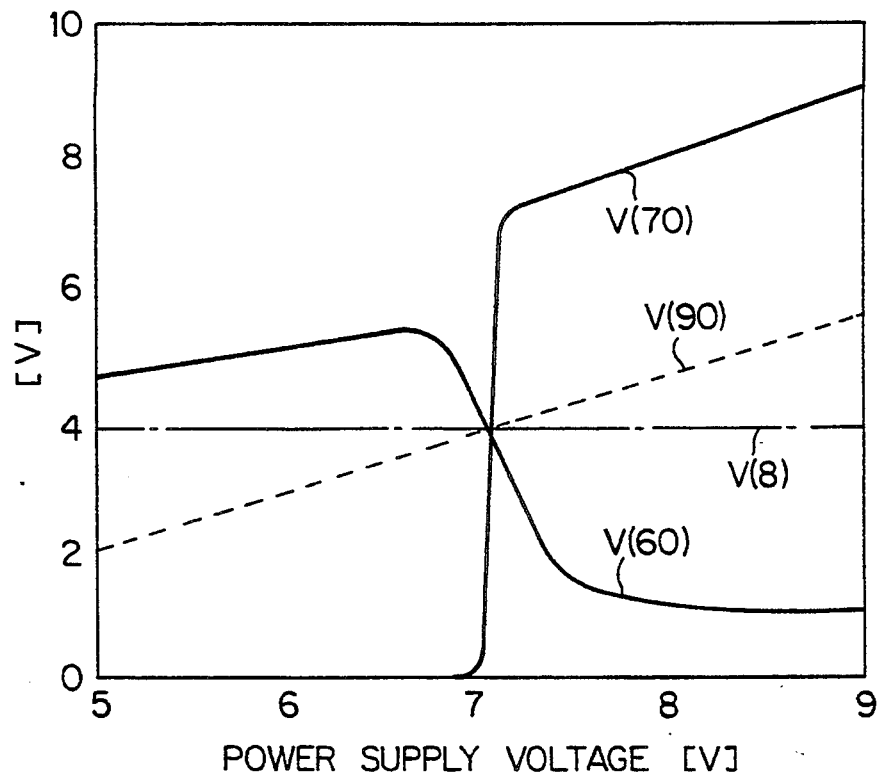
FIG. 4 is a graph showing the power supply voltage dependency of output voltage of each circuit in the power supply voltage level detecting circuit shown in FIG. 3.

FIG. 4 is a graph showing the power supply voltage dependency of the output voltage of each circuit of the power supply voltage level detecting circuit shown in FIG. 3. Referring to FIG. 4, the ordinate shows the power supply voltage, and the abscissa shows each of output voltages. The same reference numerals as output voltages shown in FIG. 3 are given to respective curves to clarify the relation between respective curves and output voltages.

In the configuration of the power supply voltage level detecting circuit shown in FIG. 3, the voltage to be compared V(90) is Vcc-2·Vthp. The threshold voltage of transistors 56 and 57 is almost constant regardless of the level of the power supply voltage Vcc. Therefore, the voltage to be compared V(90) can express change in the power supply voltage Vcc as it is. More specifically, in the case of the power supply voltage level detecting circuit shown in FIG. 1, change in the power supply voltage Vcc, multiplied by R52/(R51+R52), appears at the voltage to be compared V(9). Therefore, the configuration of the to-be-compared voltage generating circuit 55 shown in FIG. 3 makes it possible to express change in the power supply voltage Vcc more clearly, allowing to produce a signal corresponding to the power supply voltage level in the differentially amplifying circuit 6 more precisely to generate a more accurate level detecting signal V(70).

If on-resistances of transistors 56, 57 and 58 are sufficiently large and of almost the same magnitude, voltages divided by the ratio of on-resistances of transistors 56, 57 and 58 are provided from the output node 90.

In the above-described embodiment, there is shown a configuration which detects when the level of power supply voltage Vcc has attained a predetermined high voltage level. In other words, a circuit configuration which generates a level detecting signal for stopping a circuit operation when the power supply voltage Vcc becomes abnormally high is shown. In this case, if the configuration has a predetermined reference level signal transmitted in place of the power supply voltage Vcc applied to the power supply line 30, it is also possible to detect a condition in which the level of the predetermined reference level signal has become abnormally high.

In the above-described embodiment, it is detected when the power supply voltage has been in a high voltage condition. As apparent from operation waveforms shown in FIGS. 2 and 4, however, it is possible to detect a condition in which the power supply voltage has attained a low level, for example, 3 V. This case can be easily considered by multiplying scales in FIGS. 2 and 4 by ½. It can be easily implemented by appropriately controlling the number or resistance values of transistors in the reference voltage generating circuit 8 and the to-be-compared voltage generating circuit 5 or 55.

In the configuration shown in FIG. 3, n channel MOS transistors may be used for transistors 56 and 57 used in the to-be-compared voltage generating circuit 55.

As described above, according to the present invention, it is determined whether or not the first voltage has attained a predetermined level by differentially amplifying a constant voltage independent of the first voltage level and a voltage to be compared changing dependent upon the first voltage in the differentially amplifying circuit. This makes it possible to detect the first voltage level without depending on an input logic threshold voltage of an inverter circuit, allowing to obtain a voltage level detecting circuit which can detect a voltage level in an accurate and stable manner without being affected by variation of element parameters in the manufacturing process.

According to the aforementioned preferred aspect of the present invention, since comparison between the reference voltage and the voltage to be compared is made by using a current mirror type differentially amplifying circuit, it is possible to amplify the difference between the voltage to be compared and the reference voltage accurately at high speed, resulting in an accurate detection of the first voltage level regardless of variation of an input logic threshold voltage of the inverter circuit of the determining circuit at the next stage.

According to the aforementioned another preferred aspect of the present invention, the voltage to be compared is generated by dropping the first voltage using the forward voltage drop of diode. This makes it possible to generate the voltage to be compared which reflects change in the first voltage more accurately, resulting in accurate determination of whether or not the first voltage has attained a predetermined level.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A circuit device for detecting a level of a power supply voltage, comprising:
    a first terminal for receiving said power supply voltage;
    reference voltage generating circuit for generating a reference voltage substantially independent of variations in the power supply voltage, said reference voltage generating circuit including:
        a first field effect transistor having a source connected to said first terminal, a drain connected to a first output node, for outputting said reference voltage, and a gate connected to ground, said first transistor being configured as a load resistance,
        a second field effect transistor having a drain connected to said first output node, a source, and a gate connected to a second terminal for receiving a reset signal, and
        at least one third field effect transistor connected in series between the source of said second field effect transistor and ground, said at least one third field effect transistor having a gate and a drain connected together and configured as a diode;
    a to-be-compared voltage generating circuit for generating a to-be-compared voltage which varies with said power supply voltage including:
        a first resistance having one terminal connected to said first terminal, and a second terminal connected to a second output node for outputting said to-be-compared voltage,
        a second resistance having one terminal connected to said second output node and a second terminal, and
        a fourth field effect transistor, having a drain connected to said second terminal of said second resistance, a gate connected to said second terminal for receiving said reset signal, and a source connected to ground,
        said first resistance and said second resistance being arranged as a voltage divider;
    differentially amplifying means for differentially amplifying the reference voltage and the to-be-compared voltage, including:
        a current mirror type amplifier comprising,
            a fifth field effect transistor having a source connected to said first terminal, and a gate and a drain connected together,
            a sixth field effect transistor having a source connected to said first terminal, a gate connected to the gate of said fifth field effect transistor and a drain connected to a third output node for outputting a difference signal between said reference voltage and said to-be-compared voltage,
            a seventh field effect transistor having a drain connected to the drain of said fifth field effect transistor, a gate connected to said first output node, and a source,
            an eighth field effect transistor having a drain connected to said third output node, a gate connected to said second output node, and a source connected to the source of said seventh field effect transistor, and
            a ninth field effect transistor having a drain connected to the sources of said seventh and eighth field effect transistors, a gate connected to said second terminal for receiving said reset signal, and a drain connected to ground; and
    a determining circuit connected to and responsive to the differentially amplifying circuit for determining whether the power supply voltage has attained a predetermined level, including:
        an inverter circuit comprising:
            a tenth field effect transistor having a source connected to said first terminal, a gate connected to said third output node, and a drain connected to a fourth output node for outputting a signal indicative of whether said power supply voltage has attained a predetermined level, and
            a eleventh field effect transistor having a drain connected to said fourth output node a gate connected to said third output node, and a source connected to ground.

2. A circuit device for detecting a level of a power supply voltage, comprising:
    a first terminal for receiving said power supply voltage;
    reference voltage generating circuit for generating a reference voltage substantially independent of variations in the power supply voltage, said reference voltage generating circuit including:
        a first field effect transistor having a source connected to said first terminal, a drain connected to a first output node, for outputting said reference voltage, and a gate connected to ground, said first transistor being configured as a load resistance,
        a second field effect transistor having a drain connected to said first output node, a source, and a gate connected to a second terminal for receiving a reset signal, and
        at least one third field effect transistor connected in series between the source of said second field effect transistor and ground, said at least one third field effect transistor having a gate and a drain connected together and configured as a diode;
    a to-be-compared voltage generating circuit for generating a to-be-compared voltage which varies with said power supply voltage including:
        at least one fourth field effect transistor connected in series between said first terminal and a second output node for outputting said to-be-compared voltage, said at least one fourth field effect transistor having a gate and a drain connected together and configured as a diode, and a fifth field effect transistor, having a drain connected to said second output node, a gate connected to said second terminal for receiving said reset signal, and a source connected to ground, differentially amplifying means for differentially amplifying the reference voltage and the to-be-compared voltage, including:

a current mirror type amplifier comprising, a sixth field effect transistor having a source connected to said first terminal, and a gate and a drain connected together, a seventh field effect transistor having a source connected to said first terminal, a gate connected to the gate of said sixth field effect transistor and a drain connected to a third output node for outputting a difference signal between said reference voltage and said to-be-compared voltage, an eighth field effect transistor having a drain connected to the drain of said sixth field effect transistor, a gate connected to said first output node, and a source, an ninth field effect transistor having a drain connected to said third output node, a gate connected to said second output node, and a source connected to the source of said eighth field effect transistor, and a tenth field effect transistor having a drain connected to the sources of said eighth and ninth field effect transistors, a gate connected to said second terminal for receiving said reset signal, and a source connected to ground; and a determining circuit connected to and responsive to the differentially amplifying circuit for determining whether the power supply voltage has attained a predetermined level, including:

an inverter circuit comprising:

an eleventh field effect transistor having a source connected to said first terminal, a gate connected to said third output node, and a drain connected to a fourth output node for outputting a signal indicative of whether said power supply voltage has attained a predetermined level, and a twelfth field effect transistor having a drain connected to said fourth output node a gate connected to said third output node, and a source connected to ground.

* * * * *